United States Patent
Kim et al.

(10) Patent No.: US 8,287,670 B2
(45) Date of Patent: Oct. 16, 2012

(54) ELECTRONIC COMPONENT BONDING METHOD AND APPARATUS USING VIBRATION ENERGY

(75) Inventors: Kyung-Soo Kim, Daejeon (KR);
Taeyoung Jang, Daejeon (KR);
Chang-Wan Ha, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 347 days.

(21) Appl. No.: 12/702,190

(22) Filed: Feb. 8, 2010

(65) Prior Publication Data
US 2010/0206457 A1    Aug. 19, 2010

(30) Foreign Application Priority Data
Feb. 16, 2009    (KR) .................. 10-2009-0012387

(51) Int. Cl.
B32B 37/00    (2006.01)
(52) U.S. Cl. .................. 156/64; 156/73.1; 156/307.1
(58) Field of Classification Search .................. 156/64, 156/73.1, 73.5, 273.3, 275.5, 307.1
See application file for complete search history.

(56) References Cited

U.S. PATENT DOCUMENTS

| | | | | |
|---|---|---|---|---|
| 6,460,591 | B1 * | 10/2002 | Gotoh et al. | 156/359 |
| 6,544,364 | B2 * | 4/2003 | Maeda et al. | 156/64 |
| 7,892,372 | B2 * | 2/2011 | Lee et al. | 156/64 |
| 8,197,624 | B2 * | 6/2012 | Beehag et al. | 156/73.1 |

FOREIGN PATENT DOCUMENTS

| | | |
|---|---|---|
| KR | 10-2007-25889 | 3/2007 |
| KR | 10-2008-0049043 A | 6/2008 |

OTHER PUBLICATIONS

Chan, Y.C.; "Behavior of Anisotropic Conductive Film (ACF) Joint Under Mechanical Shock"; Journal of Electronic Packaging; vol. 127375-380; 2005.
Lee, Ki Won; et al.; "Curing and Bonding Behaviors of Anisotropic Conductive Films (ACFs) by Ultrasonic Vibration for Flip Chip Interconnection"; Electronic Components and Technology Conference; 918-923; 2006.
Wu, Y.P.; et al.; "Dynamic Strength of Anisotropic Conductive Joints in Flip Chip on Glass and Flip Chip on Flex Packages"; Microelectronics Reliability; 295-302; 2004.
Chan, Y.C.; "Effects of Bonding Parameters on the Reliability Performance of Anisotropic Conductive Adhesive Interconnects for Flip-chip-on-flex Packages Assembly I. Differenct Bonding Temperature"; Microelectronics Reliability; 1185-1194; 2002.

(Continued)

*Primary Examiner* — James Sells
(74) *Attorney, Agent, or Firm* — Edwards Wildman Palmer LLP

(57) ABSTRACT

Disclosed is an electronic component bonding method which interposes a bonding resin between first and second electronic components to bond the first and second electronic components to each other. The electronic component bonding method includes providing the bonding resin between the first and second electronic components, aligning the first and second electronic components with each other, pre-curing the bonding resin to generate elasticity in the bonding resin, performing a main curing operation to apply vibration energy to the bonding resin, which has elasticity according to pre-curing, to securely fix the first and second electronic component to each other, and control the amplitude of the vibration energy applied during the main curing operation to be restricted within an elastic region of the bonding resin.

4 Claims, 7 Drawing Sheets

OTHER PUBLICATIONS

Chan, Y.C., et al.; "Effects of Bonding Parameters on the Reliability Performance of Anisotropic Conductive Adhesive Interconnects for Flip-chip-on-flex packages Assembly II. Different Bonding Pressure"; Microelectronics Reliability; 1195-1204; 2002.

Nonhof, C.J.; et al.; "Estimates for Process Conditions During the Ultrasonic Welding of Thermoplastics" 1177-1183; vol. 36, No. 9; 1996.

Song, Aijun; et al.; "Experimental Identification of Parasitic Vibrations on Ultrasonic Bonding Transducer" Proceedings of HDP'06; 2006.

Aschenbrenner R.; et al.; "Flip Chip Attachment Using Anisotropic Conductive Adhesives and Electroless Nickel Bumps" IEE Transaction on Components, Packaging, and Manufacturing Technology—Part C, vol. 20 No. 2, Apr. 1997.

Vandevelde, B.; et al.; "Improved Thermal Fatigue Reliability for Flip Chip Assemblies Using Redistribution Techniques"; IEEE Transactions on Advanced Packaging, vol. 23, No. 2, May 2000.

Sancaktar, E.; "Polymer Adhesion by Ultrasonic Welding" J. Adhesion Sci. Technol.. vol. 13, No. 2. pp. 179-201; 1999.

Kim, Jin-Yeol; et al.; "Reliability and Thermodynamic Studies of an Anisotropic Conductive Adhesive Film (ACAF) Prepared From Epoxy/Rubber Resins"; Jounal of Materials Processing Technology 152 pp. 357-362; 2004.

Kim, Jung H., et al.; "Soldering Method Using Longitudinal Ultrasonic" IEEE Transactions on Components and Packaging Technologies, vol. 28, No. 3; 2005.

S S Volkov; "Technological Special Features of Ultrasound Welding Polymer Films" Welding International, 243-248, 2001.

Jang, T.Y.; et al.; "Thermo-Compression Ultrasonic Bonding Technology for Mounting IT Components with High-Density Pin Counts" Journal of Korean Fine Machinery, 2008.

Joung, Sang Won; et al.; "Ultrasonic ACF Bonding Technique for Mounting LCD Driver ICs"; Journal of Institute of Control, Robotics and Systems vol. 14, No. 6, 2008.

Lee, K., et al.; Ultrasonic Anisotropic Conductive Films (ACFs) Bonding of Flexible Substrates on Organic Rigid Boards at Room Temperature; Electronic Components and technology Conference; 480-486, 2007.

Jang, Tae-Young; et al.; "Using Ultrasonic Energy for Reducing ACF Bonding Process Time", International Electronics Manufacturing Technolgy Conference 2008.

Garrou, P.; Wafer Level Chip Scale Packaging (WL-CSP): An Overview: IEEE Transactions on Advanced Packaging, vol. 23, No. 2, 2000.

* cited by examiner

ELECTRONIC COMPONENT BONDING METHOD AND APPARATUS USING VIBRATION ENERGY

CROSS-REFERENCE TO RELATED APPLICATION

This application claims the benefit of priority under 35 U.S.C. §119(a) to Korean Patent Application No. 10-2009-0012387, filed on Feb. 16, 2009, the entire contents of which are incorporated herein by reference

BACKGROUND OF THE INVENTION

1. Field of the Invention

The present invention relates to an electronic component bonding method using vibration energy and a vibration energy supply apparatus used for the bonding method, and more particularly, to a method of bonding electronic components having pins arranged in a high density and a vibration energy supply apparatus used for the method.

2. Background of the Related Art

As the sizes of electronic devices decrease, the sizes of electronic components included therein also decrease and density of pins for connecting the electronic components to a circuit board increases. Small-sized components having pins arranged in a high density are packaged using bonding techniques such as ball grid array (BGA) and chip scale packaging (CSP) based on flip chip bonding. For the flip chip bonding, thermo-compression bonding is widely used. However, the thermo-compression bonding requires a high temperature in the initial stage and increases processing time.

To solve the shortcoming of the thermo-compression bonding, a bonding technique using ultrasonic vibration energy has been proposed. Electronic components can be bonded to each other or packaged within a short time at a low temperature when ultrasonic vibration energy is used for bonding.

Recently, a technique employing both the thermo-compression bonding method and the bonding method using ultrasonic vibration energy has been proposed.

Ultrasonic vibration energy can be applied to electronic components in the vertical or horizontal direction. If the ultrasonic vibration energy is applied to the electronic components in the vertical direction, that is, in a direction in which neighboring electronic components become closer to each other, planarity of electronic components is deteriorated so as to decrease bonding reliability. If the ultrasonic vibration energy is applied to the electronic components in the horizontal direction, pre-aligned electronic components are deviated from their positions to decrease alignment reliability although the aforementioned planarity deterioration is prevented.

SUMMARY OF THE INVENTION

Accordingly, the present invention has been made in view of the above-mentioned problems occurring in the prior art, and it is a primary object of the present invention to provide an electronic component bonding method and a vibration energy supply apparatus used for the bonding method, which do not affect electronic component alignment reliability even when vibration energy is applied to electronic components in the horizontal direction and prevent planarity deterioration.

The present invention provides an electronic component bonding method for bonding a first electronic component and a second electronic component, which comprises a step for dispensing bonding resin between the first electronic component and the second electronic component; a step for aligning the first electronic component and the second electronic component to each other; a step for carrying out pre-curing the bonding resin to a degree to which the bonding resin interposed between the first and second electronic components has appropriate elasticity; a step for carrying out main curing the bonding resin having the elasticity by applying vibration energy such that the first electronic component and the second electronic component are securely fixed to each other; and a step for controlling the amplitude of the vibration applied in the main curing within the elastic region of the bonding resin.

Preferably, the pre-curing is carried out by thermo-compression process and the vibration energy is applied along with thermo-compression in the main curing.

According to another preferred embodiment, the vibration energy is horizontally applied to the first electronic component and the second electronic component.

It is also preferred that the step for controlling the amplitude is a step for controlling the amplitude within the elastic region varying in accordance with curing degree of the bonding resin.

The present invention also provides a vibration energy supply apparatus for controlling the amplitude to be used in the method mentioned above, which comprises an oscillator; a controller for controlling vibration generated by the oscillator; and a main body for transmitting the vibration to at least one of the first electronic component and the second electronic component. The controller controls the main body such that the main body vibrates within the elastic region.

For example, the main body comprises a piezoelectric device and the controller controls voltage or currents supplied to the piezoelectric device such that the main body vibrates within the elastic region.

According to the second aspect of the present invention, the apparatus comprises an oscillator; a controller for controlling vibration generated by the oscillator; a main body for transmitting the vibration to at least one of the first electronic component and the second electronic component; and a pressure applying unit for applying pressure to the main body such that the main body vibrates within the elastic region.

According to the third aspect of the present invention, the apparatus comprises an oscillator; a controller for controlling vibration of the oscillator; a main body for transmitting the vibration of the oscillator to at least one of the first electronic component and the second electronic component; a booster for amplifying the vibration of the oscillator and then transmitting it to the main body; a smart material for applying its physical output to the main body and/or the booster; and a controller of smart material for controlling the physical input of the smart material such that the main body vibrates within the elastic region.

BRIEF DESCRIPTION OF THE DRAWINGS

The objects and features of the present invention will become apparent from the following description of preferred embodiments, given in connection with the accompanying drawings, in which.

DETAILED DESCRIPTION OF THE PREFERRED EMBODIMENT

The present invention will be described in detail by explaining preferred embodiments of the invention with reference to the attached drawings.

Figure 1:
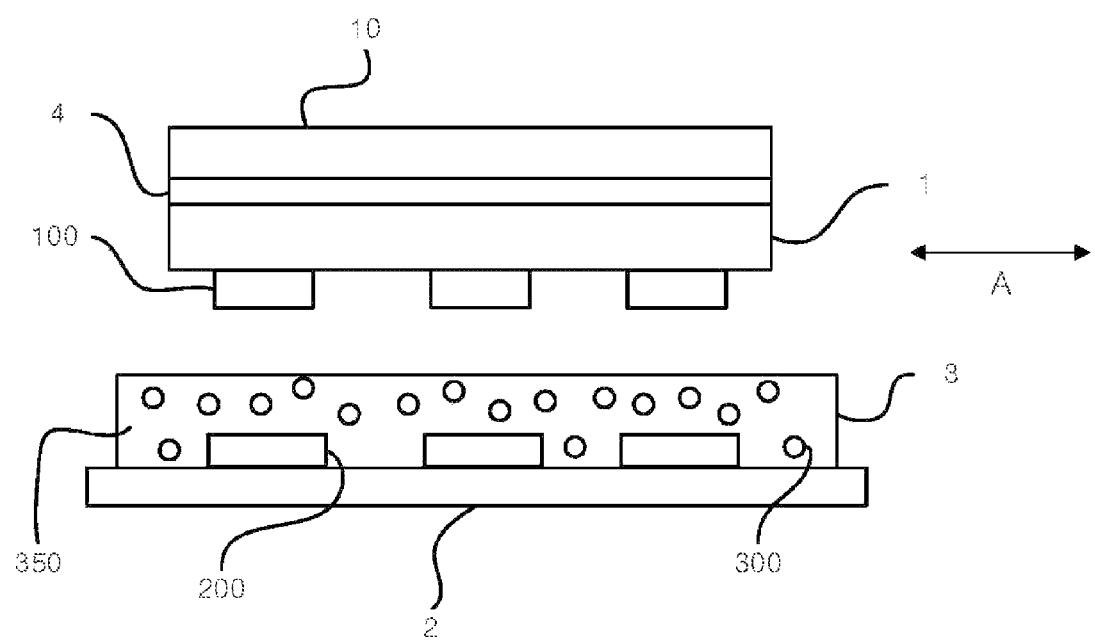
FIG. 1 shows the arrangement of the electronic components before they are bonded by the bonding method of the present invention.
Figure 2:
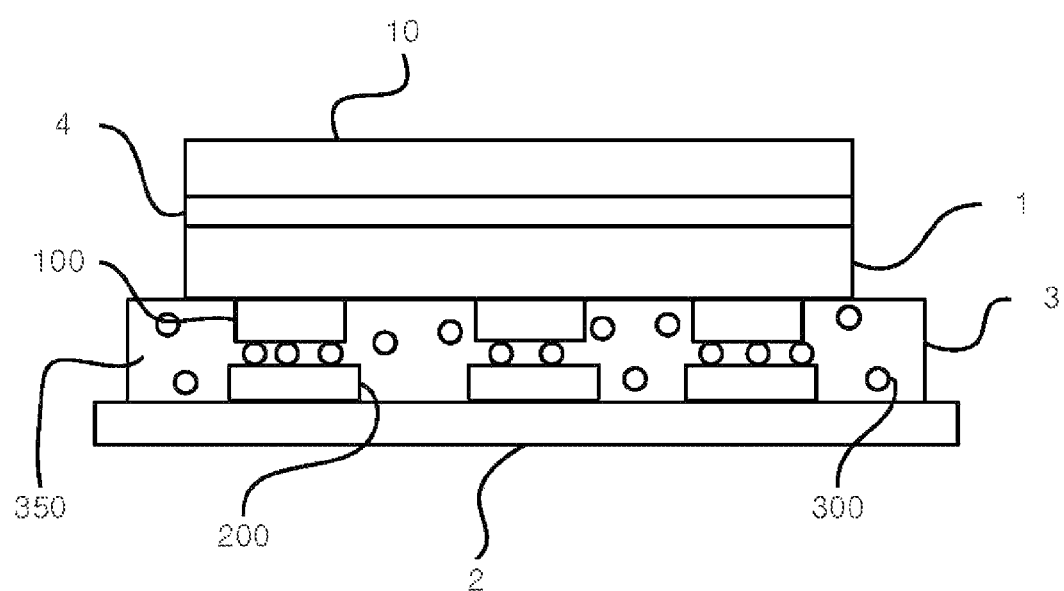
FIG. 2 shows the arrangement of the electronic components after they are bonded by the bonding method of the present invention.

FIGS. 1 and 2 show electronic components before and after bonded to each other through an electronic component bonding method according to the present invention.

Referring to FIG. 1, there are provided a first electronic component 1 receiving vibration energy from a vibration energy supply apparatus 10, a second electronic component 2, and a bonding resin 3 interposed between the first electronic component 1 and the second electronic component 2. A polymer 4 may be used as a shock absorbing material between the vibration energy supply apparatus 10 and the first electronic component 1. The first electronic component 1 may be provided with bumps 100 and the second electronic component 2 may be provided with pads 200.

Isotropic conductive adhesive (ICA), anisotropic conductive adhesive (ACF) or non-conductive adhesive (NCA) may be used as the bonding resin 3. An appropriate bonding resin can be used as the bonding resin 3 according to types of electronic components or boards to be bonded. FIGS. 1 and 2 illustrate a case of using ACF containing conductive particles 300 as the bonding resin 3. The bonding resin 3 includes a film 350 made of thermosetting epoxy resin or acryl resin and the conductive particles 300 randomly distributed in the film 350.

In a process shown in FIGS. 1 and 2, the first electronic component 1 is excited with the vibration energy supply apparatus and pressed against the second electronic component 2. The vibration energy supply apparatus 10 may include a heat source (not shown). The heat source may be set in the vibration energy supply apparatus 10 using a conventional technique. This is not important in description of the present invention so that detailed explanation thereof is omitted.

FIG. 2 shows the first and second electronic components 1 and 2 being bonded to each other. In the bonded state, the conductive particles 200 existing in the bonding resin 3 are arranged between the bumps 100 of the first electronic component and the pads 200 of the second electronic component 2 to conductively connect the first and second electronic components 1 and 2 to each other. The conductive particle 300 has a first metal layer, for example, a layer coated with gold, as the outermost layer, a second metal layer, for example, a nickel layer, formed on the inner side of the first metal layer, and a polymer core.

Figure 3:
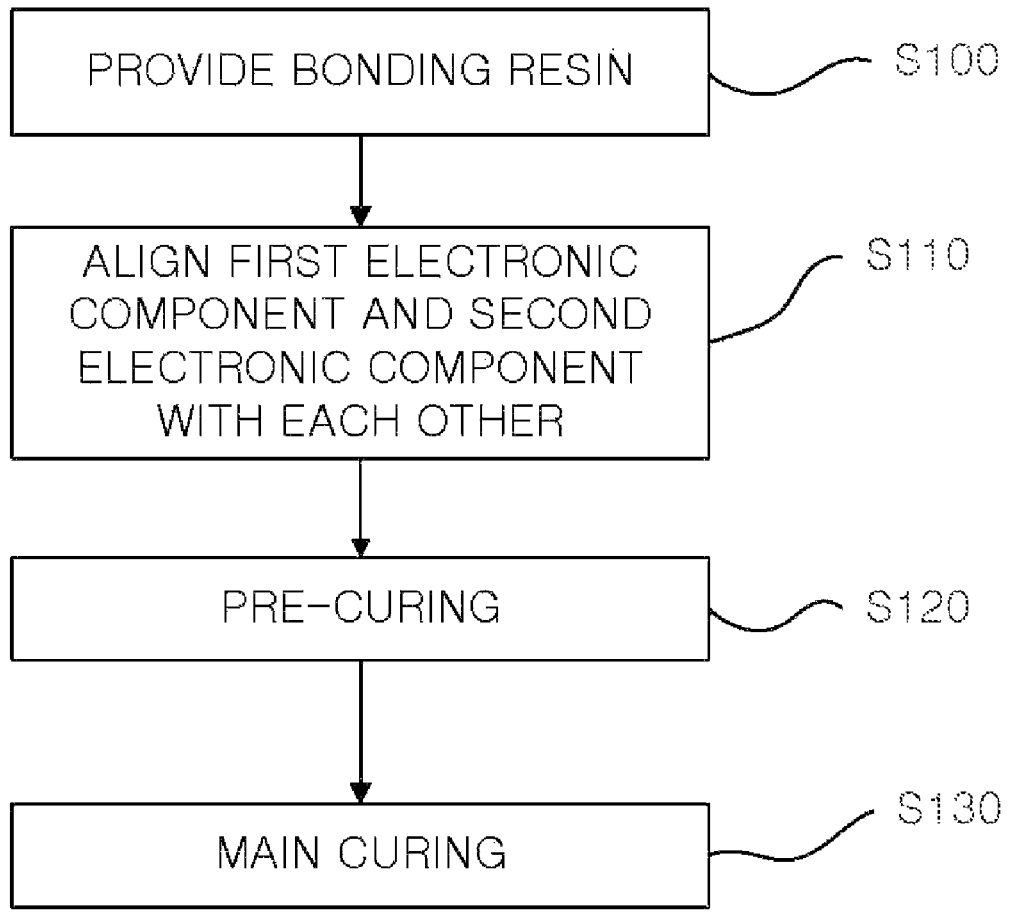
FIG. 3 shows a flowchart of the bonding method of the present invention.

FIG. 3 is a flowchart showing an electronic component bonding method according to the present invention. The appropriate bonding resin 3 (shown in FIG. 3) is dispensed between the first and second electronic components 1 and 2 (shown in FIG. 1) in the step S100. The first and second electronic components 1 and 2 are aligned with each other in the step S110. Pre-curing is performed on the first and second electronic components 1 and 2 aligned with each other in the step S120. The pre-curing may be performed through thermo-compression. The pre-curing is carried out to a degree to which the bonding resin interposed between the first and second electronic components 1 and 2 has appropriate elasticity. Specifically, the pre-curing is carried out such that the bonding resin 3 interposed between the first and second electronic components 1 and 2 has adhesiveness and elasticity and thus the first and second electronic components 1 and 2 can be returned to the aligned positions thereof even if the first and second electronic components 1 and 2 are dislocated against each other in the elastic region.

The time and pressure required for the pre-curing depend on the type of the bonding resin and are determined through experiments.

According to experiments performed by the inventor, thermo-compression for pre-curing is performed at a temperature of 80° C. and pressure of 1 MPa for two seconds to generate appropriate elasticity in the bonding resin when ACF including an epoxy resin film having a thickness of 25±5 μm coated with Ni/Au, and conductive particles having a diameter of 4 μm is used as the bonding resin, an LCD driving IC (having a width of 24.2 mm, length of 2.2 mm and thickness of 0.5 mm) is used as the first electronic component 1, and an LCD panel (having a width of 40.1 mm, length of 56.9 mm and thickness of 1.55 mm) is used as the second electronic component 2.

Main curing is performed after the pre-curing in the step S130. During the main curing, vibration energy is applied to the electronic components while thermo-compression is carried out on the electronic components or only vibration energy is applied to the electronic components. Here, the vibration energy is applied to the electronic components in the horizontal direction (indicated by arrow A in FIG. 1). In the specification, "horizontal direction" means a direction in which planarity of electronic components is not deteriorated and, in general, a direction parallel with the surfaces of the electronic components, as represented by arrow A in FIG. 1. The vibration energy is applied to the first electronic component 1 according to the vibration energy supply apparatus 10.

When the vibration energy is applied to electronic components in the horizontal direction, as described above, planarity of the electronic components is not deteriorated. During the main curing, the vibration should be applied within the elastic region, which is generated in the bonding resin 3 according to pre-curing. If the first electronic component 1 vibrates within the elastic region, accuracy of alignment of the first and second electronic components 1 and 2 is not deteriorated, and thus the shortcomings caused by lateral vibration do not occur. The vibration energy applied during the main curing may correspond to ultrasonic vibration. However, the vibration energy can be any mechanical vibration capable of generating heat, such as vibration energy in the audio frequency range, irregular vibration, etc.

As the thermal energy according to the vibration energy (or the vibration energy along with thermo-compression) are applied during the main curing operation, the degree of cure of the bonding resin 3 is changed so as to affect the elastic region. The maximum amplitude of the vibration energy applied during the main curing step is controlled to be changed according to the varying elastic region, for example, to be reduced as the degree of cure of the bonding resin 3 increases.

The quantity of energy required to cure epoxy bonding resin can be measured using differential scanning calorimetry (DSC). Total energy required for curing can be known through dynamic experiment and energy required with the lapse of time can be calculated through isothermal experiment. From results of these experiments, a degree to which the bonding resin is cured as energy is supplied thereto can be detected and a curing estimation formula can be created based on the degree of cure. Further, it is possible to calculate time required to obtain a desired degree of cure under a predetermined condition using the curing estimation formula.

The bonding resin 3 allows the first and second electronic components 1 and 2 to be securely fixed each other according to the main curing operation. "Secure fixing" means maintaining electrical connecting state of the first and second electronic components 1 and 2 such that the first and second electronic components 1 and 2 are not separated from each other. However, "secure fixed" state does not necessarily mean a state wherein elasticity in the resin is completely removed.

Figure 4:
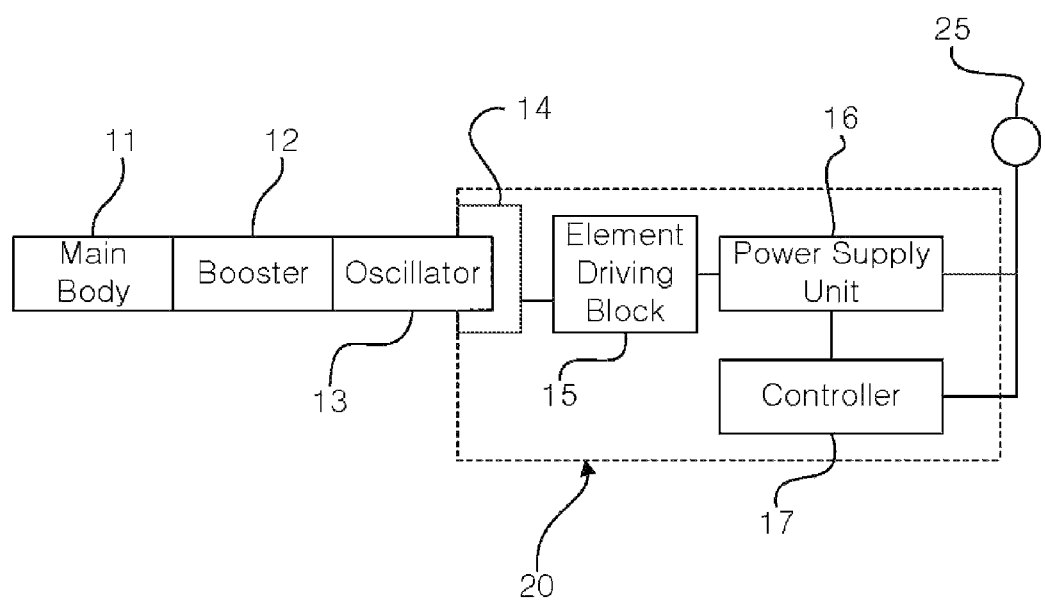
FIG. 4 shows a block diagram of the vibration energy supply apparatus of the present invention.

FIG. 4 shows a block diagram of the vibration energy supply apparatus 10 used for the electronic component bonding method according to the present invention. The vibration energy supply apparatus 10 includes a main body 11 for applying vibration to the first electronic component 1 (shown in FIG. 1), a booster 12, and an oscillator 13. A bolt-clamped Langevin transducer (BLT) may be used as the oscillator 13. Furthermore, the vibration energy supply apparatus 10 includes an element 14 that is attached to the oscillator 13 or the main body 11 or interacts with the oscillator 13 or the main body 11 to control the maximum amplitude of vibration energy provided by the vibration energy supply apparatus 10, an element driving block 15 for driving the element 14, a power supply unit 16 for supplying power to the element driving block 15, and a controller 17. The power supply unit 16 and the controller 17 receive power from a power supply 25.

The element 14 may be a variable resistor, a piezoelectric device or an electric field or magnetic field generator. The controller 17 controls the element 14 according to a predetermined control program such that vibration energy has a maximum amplitude within the varying elastic region of the pre-cured bonding resin 3 (shown in FIG. 1) so as to vibrate the vibration energy supply apparatus 10. The element 14, the element driving block 15, the power supply unit 16 and the controller 17 are represented as a control unit 20.

Figure 5:
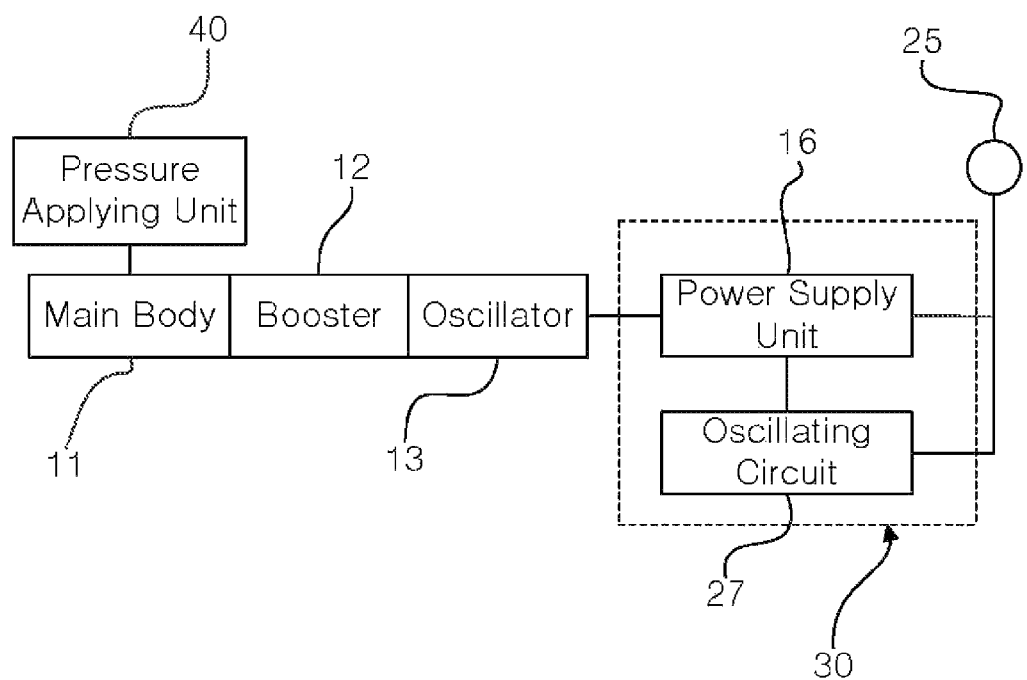
FIG. 5 shows a block diagram of an another embodiment of the vibration energy supply apparatus of the present invention.

FIG. 5 illustrates another embodiment of the vibration energy supply apparatus 10 according to the present invention. In the current embodiment, the oscillator 13 generates vibration according to an oscillating circuit 27 and the power supply unit 16 and the booster 12 amplifies the vibration to vibrate the main body 11. A pressure applying unit 40 applies pressure to the vibrating main body 11 to control the amplitude of the vibrating main body 11. That is, if the pressure applying unit 40 increases the pressure applied to the main body 11 as the degree of cure of the bonding resin 3 (shown in FIG. 1) increases, friction between electronic components or between an electronic component and the bonding resin 3 and viscoelasticity of the bonding resin 3 increase, and thus the amplitude of the main body 11, that is, the vibration energy supply apparatus 10, can be reduced. Any means capable of acting on the main body 11 to control the maximum allowable amplitude of the main body 11 can be used to replace the pressure applying unit 40. The amplitude of vibration transmitted from the main body 11 to the first electronic component is determined by the stationary wave form of the main body 11, the vibration form of the booster 12, the vibration amplitude of the oscillator 13 and output of the oscillating circuit 27, and thus methods capable of manually or actively controlling these factors can be used. Examples of the methods include a method of actively control vibration of the main body through a smart material such as a piezoelectric device set in or attached to the main body, a method of actively control vibration of the booster through a smart material such as a piezoelectric device set in or attached to the booster, and a method of controlling the output of the oscillating circuit to actively (or manually) adjust the amplitude of the oscillator.

Figure 6:
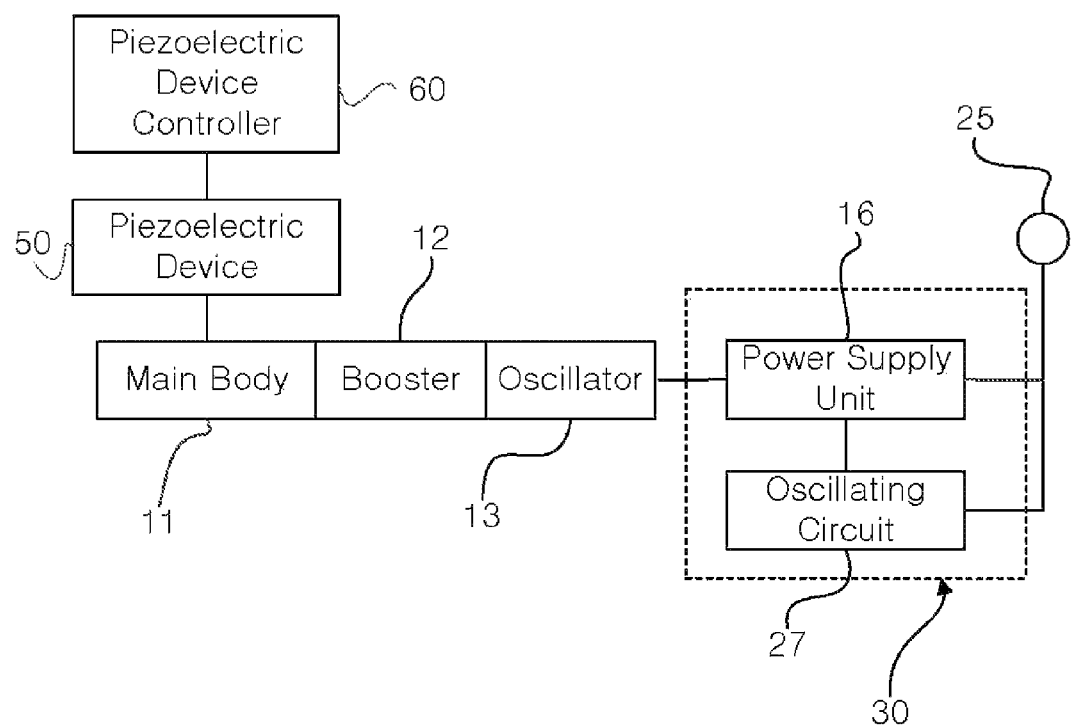
FIG. 6 shows a block diagram of a still other embodiment of the vibration energy supply apparatus of the present invention.

FIG. 6 is a block diagram of a vibration energy supply apparatus which includes a piezoelectric device 50 attached to the main body 11 to control vibration of the main body 11. While the piezoelectric device 50 is attached to the main body 11 in the current embodiment, any material or device can be used if it is a smart material and can control vibration of the main body 11. A predetermined physical value is input to the piezoelectric device 50 according to a piezoelectric device controller 60, and the piezoelectric device 50 generates an output in response to the physical value. The output is applied to the main body 11 to control vibration of the main body 11. The vibration of the main body 11 is restricted within the elastic region generated during the pre-curing operation, as described above.

While the embodiment in which the piezoelectric device 50 acts on the main body 11 has been described with reference to FIG. 6, the piezoelectric device 50 may act on the booster 12 to control vibration of the booster 12, to thereby control vibration of the main body 11.

Figure 7:
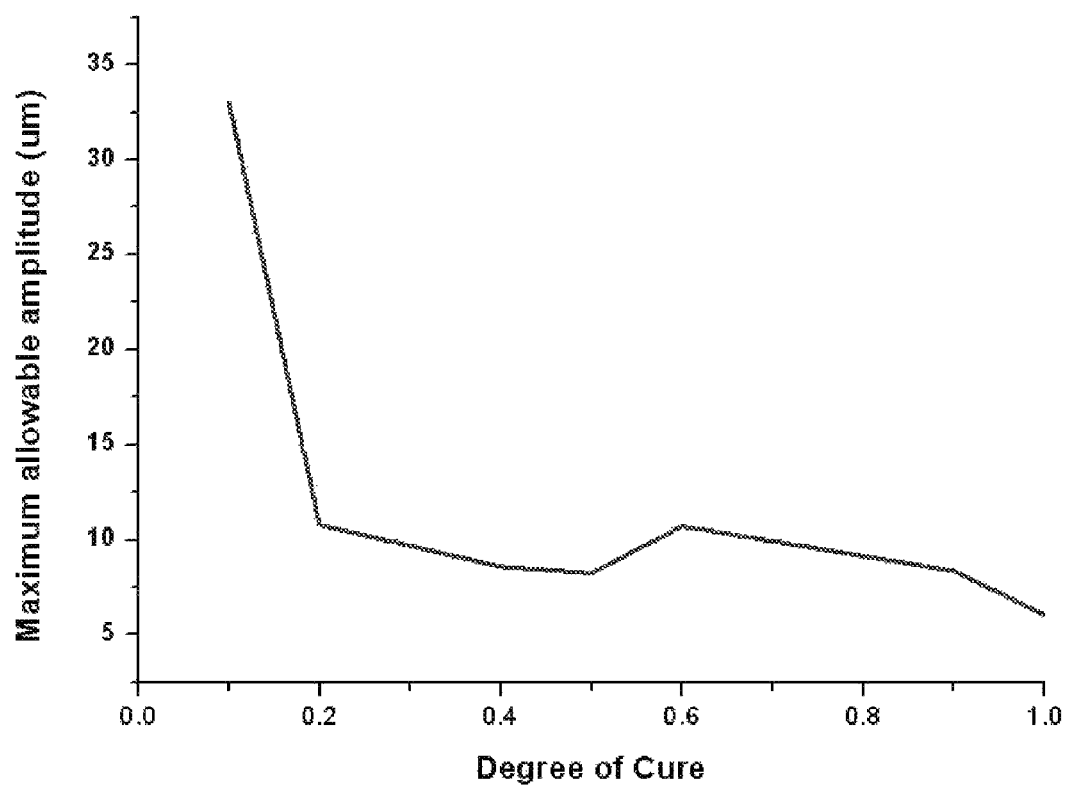
FIG. 7 shows a graph indicating maximum allowable amplitude according to degree of cure.

In the bonding method according to the present invention, the maximum amplitude of the vibration energy provided by the vibration energy supply apparatus 10 is experimentally obtained under the following condition. FIG. 7 shows maximum allowable amplitude according to degree of cure.

[Experimental Condition with Respect to FIG. 7]

An LCD driving IC (having a width of 24.2 mm, length of 2.2 mm and thickness of 0.5 mm) is used as the first electronic component 1, an LCD panel (having a width of 40.1 mm, length of 56.9 mm and thickness of 1.55 mm) is used as the second electronic component 2, and ACF is used as an adhesive material. Thermo-compression is performed to form samples having respective degrees of cure. A tensile test is performed on each sample to measure a maximum elastic region.

The bonding method according to the present invention can be performed by controlling vibration of the oscillator 13 through the active or passive element 14, constructing a control circuit that acts on the main body 11 to control amplitude of the main body 11, or creating a control algorithm with reference to the maximum allowable amplitude obtained through experiments under the above-described condition.

While the present invention has been described with reference to the particular illustrative embodiments, it is not to be restricted by the embodiments but only by the appended claims. It is to be appreciated that those skilled in the art can change or modify the embodiments without departing from the scope and spirit of the present invention.

What is claimed is:

1. An electronic component bonding method for bonding a first electronic component and a second electronic component, said method comprising:
    a step for dispensing bonding resin between the first electronic component and the second electronic component;
    a step for aligning the first electronic component and the second electronic component to each other;
    a step for carrying out pre-curing the bonding resin to a degree to which the bonding resin interposed between the first and second electronic components has appropriate elasticity;
    a step for carrying out main curing the bonding resin having the elasticity by applying vibration energy such that the first electronic component and the second electronic component are securely fixed to each other; and
    a step for controlling the amplitude of the vibration applied in the main curing within the elastic region of the bonding resin.

2. The method as set forth in claim 1, wherein the pre-curing is carried out by thermo-compression process and the vibration energy is applied along with thermo-compression in the main curing.

3. The method as set forth in claim 1, wherein the vibration energy is horizontally applied to the first electronic component and the second electronic component.

4. The method as set forth in claim 1, wherein the step for controlling the amplitude is a step for controlling the amplitude within the elastic region varying in accordance with curing degree of the bonding resin.

* * * * *